(12) United States Patent
Idgunji et al.

(10) Patent No.: US 7,605,644 B2
(45) Date of Patent: Oct. 20, 2009

(54) INTEGRATED CIRCUIT POWER-ON CONTROL AND PROGRAMMABLE COMPARATOR

(75) Inventors: Sachin Satish Idgunji, San Jose, CA (US); David Walter Flynn, Cambridge (GB); David William Howard, Cambridge (GB); Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 148 days.

(21) Appl. No.: 11/797,498

(22) Filed: May 3, 2007

(65) Prior Publication Data

US 2008/0272809 A1 Nov. 6, 2008

(51) Int. Cl.
 *G05F 1/10* (2006.01)
(52) U.S. Cl. ......................................... 327/544; 327/78
(58) Field of Classification Search .................. 327/78, 327/51, 544, 77, 80–83, 85, 88; 365/227, 365/229
 See application file for complete search history.

(56) References Cited

U.S. PATENT DOCUMENTS

| | | | | | |
|---|---|---|---|---|---|
| 5,760,614 | A | * | 6/1998 | Ooishi et al. ................... | 327/77 |
| 5,781,062 | A | * | 7/1998 | Mashiko et al. .............. | 327/544 |
| 6,118,266 | A | * | 9/2000 | Manohar et al. ............. | 323/316 |
| 6,292,015 | B1 | * | 9/2001 | Ooishi et al. .................... | 326/33 |
| 6,400,607 | B1 | * | 6/2002 | Pasotti et al. ............ | 365/185.21 |
| 6,504,761 | B2 | * | 1/2003 | Kai et al. ................ | 365/185.21 |
| 6,650,147 | B2 | * | 11/2003 | Conte et al. ..................... | 327/51 |
| 6,836,179 | B2 | * | 12/2004 | Mizuno et al. ............... | 327/544 |
| 6,885,215 | B1 | * | 4/2005 | Hou et al. .................... | 324/771 |
| 6,943,719 | B2 | * | 9/2005 | Yun et al. .................... | 341/155 |
| 7,031,212 | B2 | * | 4/2006 | La Rosa ...................... | 365/205 |
| 2006/0220676 | A1 | * | 10/2006 | Kanazawa .................... | 326/33 |
| 2008/0204124 | A1 | * | 8/2008 | Chakraborty et al. ........ | 327/544 |

\* cited by examiner

*Primary Examiner*—Lincoln Donovan
*Assistant Examiner*—Thomas J Hiltunen
(74) *Attorney, Agent, or Firm*—Nixon & Vanderhye P.C.

(57) ABSTRACT

An integrated circuit is provided with a main supply rail and a virtual supply rail connected by strong and weak header transistors. A power-on controller controls the switching on of the strong transistors after the virtual supply rail voltage has already been driven up to close to its operating level by the weak transistor. The power-on controller comprises a comparator monitoring a single reference voltage level with its output being latched within a latch and used to switch on the strong transistor. The comparator may be programmable to detect multiple different trigger voltage levels by using opposing charging and discharging transistors with one set of these operating in a saturated regime and the other in a regime in which the current therethrough varies in dependence upon the voltage being sensed. These opposing transistors can be used to charge or discharge a node with the state of that node being taken to generate the sensed output.

27 Claims, 8 Drawing Sheets

INTEGRATED CIRCUIT POWER-ON CONTROL AND PROGRAMMABLE COMPARATOR

BACKGROUND OF THE INVENTION

1. Field of the Invention

This invention relates to the field of integrated circuits. More particularly, this invention relates to power-on control of integrated circuits and a programmable comparator.

2. Description of the Prior Art

It is known to provide integrated circuits with one or more virtual power rails and one or more virtual ground rails. These virtual rails are selectively connected or disconnected to the main power rails and the main ground rails respectively by header transistors and footer transistors. This technique is useful in reducing power consumption, particularly due to leakage, when a block/domain within an integrated circuit is not required to be active and accordingly can be powered down and isolated from the power supply and the ground by use of the header and footer transistors.

FIG. 1 of the accompanying drawings schematically illustrates such an integrated circuit 2 including a logic block 4 drawing power from a virtual supply rail 6. The virtual supply rail 6 is connected to a main supply rail 8 via both a strong header transistor 10 and a weak header transistor 12. The strong header transistor 10 has a high conductance and the weak header transistor 12 has a comparatively low conductance. When it is desired to power-on the supply to the logic block 4 this operation is conducted in two phases. First the weak header transistor 12 is switched on to gradually raise the voltage level of the virtual supply rail 6 toward that of the main supply rail 8. The weak header transistor 12, as a consequence of its relatively low conductance, generates comparatively small inrush currents into the virtual supply rail 6 and the logic block 4 thereby helping to avoid damage and erroneous operation which could otherwise occur if the strong header transistor 10 were switched on from the outset resulting in an excessively large current and/or an undesirable dip in the main supply rail voltage, which could cause errors in other portions of the integrated circuit. When the voltage on the virtual supply rail 6 has reached a predetermined trigger level, a power-on controller 14 can at that point switch on the strong header transistor 10, which will be capable of meeting the power demands of the logic block 4 when it commences processing.

It will be appreciated by those in this technical field that the header transistors 10, 12 that are illustrated are only examples of a large number of such header transistors present on the power grid of the integrated circuit as a whole with many of these transistors being provided in parallel to link the main supply rail (S) 8 to the virtual supply rail (S) 6. The example of FIG. 1 has shown a weak header transistor 12 to be used first to bring the virtual supply rail 6 nearly up to its operating level with the strong header transistor 10 then being switched on. It may be the case that all of the header transistors are of the same strength (conductance) but the same effect is created by switching on a small proportion of the header transistors provided in parallel between the main supply rail 8 and the virtual supply rail 6 so as to limit the inrush current and the voltage drop on the main supply rail 8. When the virtual supply rail 6 has almost reached its operating voltage level, then the remainder of the header transistors can be turned on.

FIG. 2 of the accompanying drawings a graph showing the variation in the voltage on the virtual supply rail 6 with time during the power-on process. In the first portion of the power-on process the voltage rises relatively slowly through the action of the weak header transistor 12 until a trigger voltage Vtrig is reached. When this trigger voltage Vtrig is reached, the strong header transistors 10 are switched on and the voltage on the virtual supply rail 6 rapidly driven to the full operational level Vdd.

When the strong header transistors 10 are turned on as the trigger voltage is reached the relatively large currents which can flow at that time (even given the precharging by the weak header transistor 12) can result in a temporary reduction in the voltage of the virtual supply rail 6 (i.e. a glitch). In order to make the power-on controller 14 resistant to such glitches when the strong header transistors 10 are switched on, one possibility is to use a Schmitt trigger within the power-on controller 14 to detect the trigger voltage Vtrig. The hysteresis characteristic of such a Schmitt trigger will mean that once the strong header transistors 10 have been switched on when the trigger voltage Vtrig is reached, then they will not be switched off by the Schmitt trigger unless the voltage on the virtual supply rail 6 falls significantly below the trigger voltage Vtrig. This gives the power-on controller 14 a resistant to temporary dips in the virtual supply rail voltage.

SUMMARY OF THE INVENTION

Viewed from one aspect the present invention provides an integrated circuit comprising:

power switching circuitry coupled to a power source having a source voltage level and to a virtual power rail;

logic circuitry coupled to said virtual power rail to draw power therefrom; and a power-on controller coupled to said power switching circuitry to control said power switching circuitry to operate in a plurality of modes include a pre-charge mode in which said virtual power rail is connected to said power source via a weak path during pre-charging of said virtual power rail and an active mode in which said virtual power rail is connected to said power source via a strong path during active operation of said logic circuitry; wherein said power-on controller comprises:

a comparator responsive to a voltage on said virtual power rail passing a reference voltage, while being driven toward said source voltage by conduction through said power switching circuitry during said pre-charge mode, to output a sense signal; and a latch responsive to said sense signal to latch a trigger signal coupled to said power switching circuitry to switch said power switching circuitry to said active mode.

The present technique recognises that whilst the simple hysteresis provided by a Schmitt trigger may give glitch resistance to temporary variations in the virtual supply rail voltage, it can introduce more subtle problems of its own. The present techniques recognise these problems and provides a solution to them. More particularly, with the Schmitt trigger (hysteresis) approach, when the strong header transistors 10 are switched on and a power down is initiated such that the voltage on the virtual supply rail falls significantly, but not to the lower trigger level of the Schmitt trigger, then, if the power is switched back on, the strong header transistors 10 will still be switched on by the Schmitt trigger and a disadvantageously large, and potentially damaging, inrush current can occur. Thus, the different trip points provided by the Schmitt trigger for turning on and turning off the strong header transistors 10 whilst yielding glitch resistance can themselves introduce a potentially damaging condition in some situations. The present technique recognises this problem and provides the solution of a power-on controller which uses one trip point and then latches the trigger output such that even if the virtual supply rail voltage dips below the one trip point as the strong header transistors turn on, the latched trigger value will maintain the strong header transistors switched on and avoid them inappropriately being switched off by the glitch. Furthermore, if the power is switched on whilst the virtual supply rail voltage is at some intermediate level following a reset of the latch, then since the comparator is only using a single higher trigger level the strong header transistors will not be switched on until that single higher level is properly reached. It will be appreciated that whilst the above has been discussed in terms of the main supply rail, virtual supply rail and header transistors, the same technique is equally applicable for the main ground rail, virtual ground rail and footer transistors.

It will be appreciated that the power switching circuitry can take a wide variety of different forms including a power switch system with a modulated gate voltage, the use of multiple power supply rails, a multiplicity of controlled switched networks of transistors, etc. However, in some preferred embodiments said power switching circuitry comprises:

a first power rail coupled to said power source having said source voltage level;

a first transistor coupled to said first power rail and providing said strong path; and a second transistor coupled to said first power rail and providing said weak path; wherein said virtual power rail is coupled to said first transistor, during said pre-charge mode conduction through said second transistor drives said voltage on said virtual power rail toward said reference voltage and said trigger signal is coupled to said first transistor to switch said first transistor to a conductive state during said active mode.

In preferred embodiments the power-on controller is response to a power-required signal which indicates a requirement to connect the second power rail to the first power rail through at least the first transistor (normally through both the first and second transistors). The clearing of this power-required signal can be used to clear the latch and the setting of this power-required signal can be used to switch the second transistor to a conductive state to drive the initial phase of moving the virtual rail voltage to the main rail voltage.

Whilst the comparator can take a variety of different forms, there are advantages in using a programmable comparator which is responsive to a reference-setting signal to set the reference voltage to one of a predetermined set of reference voltages. This can be used to set the trigger point for the switching on of the strong transistors to match the particular requirements of a design or individual integrated circuit.

A programmable comparator can be provided in a number of different ways. However, as the power controller of the present technique is typically replicated many times across the integrated circuit, it is important that it should be area-efficient. A particularly preferred way of providing such a comparator is when the comparator comprises at least one discharge-transistor capable of removing charge from a node within said comparator at a rate controlled by a difference between a fixed voltage and said voltage on said second power rail and a plurality of charge-transistors each capable of supplying charge to said node a maximum saturated rate, said reference-setting signal controlling how many of said plurality of charge-transistor are active in supplying charge to said node in opposition to said at least one discharge-transistor removing charge from said node and accordingly by how much said voltage on said second power rail must differ from said fixed voltage in order to discharge said node.

This provides an area-efficient and effective way of combining what is an analog processing requirement associated with the comparator into a predominantly digital environment of an integrated circuit. The technique is based upon balancing a selectable number of transistors operating at their saturate current against the action of one or more other transistors operating to pass a current which varies in dependence upon the voltage which is being sensed. These different types of transistors are deployed in a manner opposing each other in their action to charge/discharge a node and thus the essentially binary state of that node being either charged or discharged can be sensed by more conventional digital type circuits.

It will be appreciated that a complementary aspect of the above comparator is one in which the comparator comprises at least one charge-transistor capable of supplying charge to a node within said comparator at a rate controlled by a difference between a fixed voltage and said voltage on said second power rail and a plurality of discharge-transistors each capable of removing charge from said node a maximum saturated rate, said reference-setting signal controlling how many of said plurality of discharge-transistor are active in removing charge from said node in opposition to said at least one charge-transistor supplying charge to said node and accordingly by how much said voltage on said second power rail must differ from said fixed voltage in order to charge said node.

The comparator can be provided with a decoder that decodes the reference-setting signal to generate a thermometer coded signal. Such thermometer-coded signals may be conveniently employed to select an appropriate number of transistors to operate in their saturated mode for the current balancing of the above technique.

Whilst the charging and discharging of the node in accordance with the above technique moves towards the behaviour of a binary signal, this behaviour can be further enhanced by the use of skewed inverters to detect the state of the node as these can compensate for any slowing of the rate of charge or discharge as the voltages reach the relevant end points.

It will be appreciated that the competing charging and discharging actions of the transistors will consume power in a manner which is normally considered disadvantageous within integrated circuits. In order to address this issue, preferred embodiments are provided with an enable transistor connected so as to selectively block the discharging or charging in response to an enable signal thereby limiting the power consumption of the comparator when it is not required whilst also forcing the node to the appropriate state ready for the next comparison operation.

Whilst the present technique can be used with a variety of fabrication technologies, it is well suited to CMOS transistors and, more particularly MTCMOS transistors.

Viewed from another aspect the present invention provides an integrated circuit comprising:

power switching means coupled to a power source having a source voltage level and to a virtual power rail;

logic means coupled to said virtual power rail to draw power therefrom; and a power-on control means coupled to said power switching means for controlling said power switching circuitry to operate in a plurality of modes include a pre-charge mode in which said virtual power rail is connected to said power source via a weak path during pre-charging of said virtual power rail and an active mode in which said virtual power rail is connected to said power source via a strong path during active operation of said logic means; wherein said power-on control means comprises:

comparator means for outputting a sense signal in response to a voltage on said virtual power rail passing a reference voltage, while being driven toward said source voltage by conduction through said power switching means during said pre-charge mode; and latch means for latching a trigger signal coupled to said power switching means in response to said sense signal to switch said power switching circuitry to said active mode.

Viewed from a further aspect the present invention provides a comparator for use within an integrated circuit and responsive to a reference-setting signal to compare a variable voltage with a selected one of a plurality of predetermined voltages, said comparator comprising:

at least one discharge-transistor capable of removing charge from a node within said comparator at a rate controlled by a difference between a fixed voltage and said variable voltage; and a plurality of charge-transistors each capable of supplying charge to said node a maximum saturated rate, said reference-setting signal controlling how many of said plurality of charge-transistor are active to supply charge to said node in opposition to said at least one discharge-transistor removing charge from said node and accordingly by how much said variable voltage must differ from said fixed voltage in order to discharge said node.

Viewed from a further aspect the present invention provides a comparator for use within an integrated circuit and responsive to a reference-setting signal to compare a variable voltage with a selected one of a plurality of predetermined voltages, said comparator comprising:

at least one charge-transistor capable of supplying charge to a node within said comparator at a rate controlled by a difference between a fixed voltage and said variable voltage; and a plurality of discharge-transistors each capable of removing charge from said node a maximum saturated rate, said reference-setting signal controlling how many of said plurality of discharge-transistor are active to remove charge from said node in opposition to said at least one discharge-transistor supplying charge to said node and accordingly by how much said variable voltage must differ from said fixed voltage in order to charge said node.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2 is a diagram illustrating the variation in virtual supply rail voltage with time during power-on;

DESCRIPTION OF THE PREFERRED EMBODIMENTS

Figure 1:
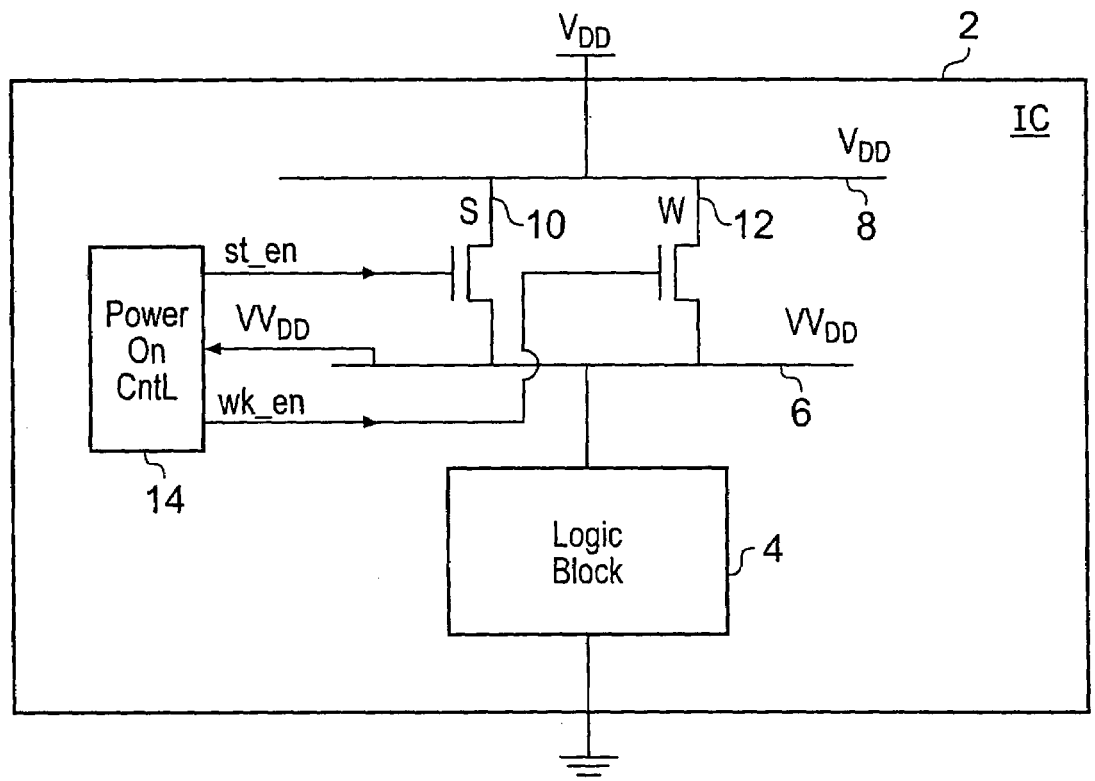
FIG. 1 schematically illustrates the use of main and virtual supply rails with strong and weak header transistors within an integrated circuit.
Figure 2:
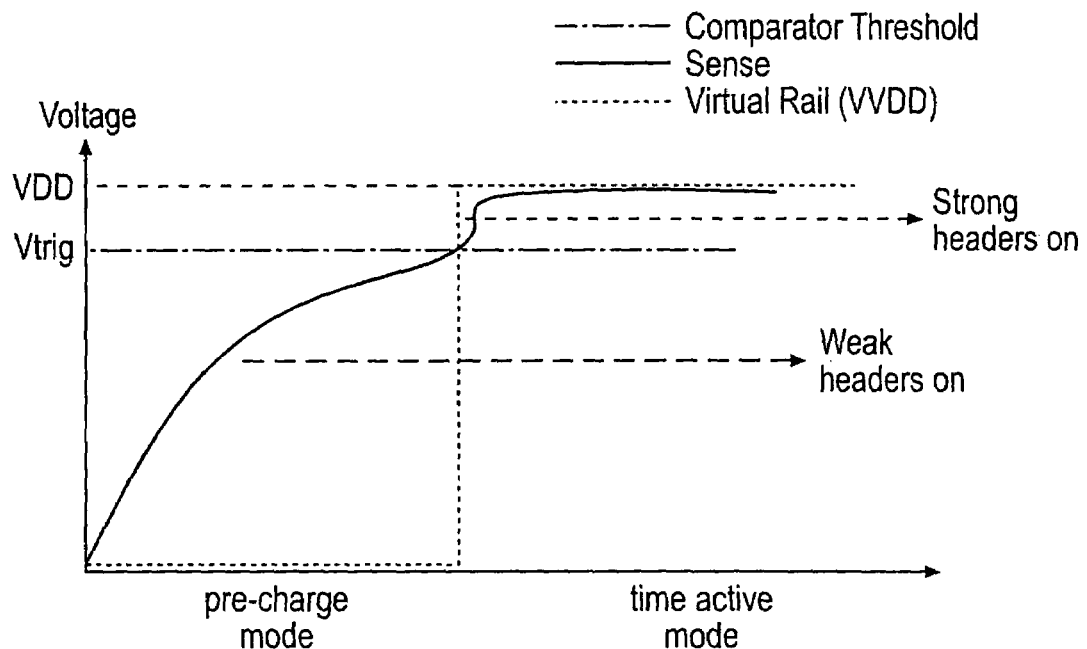
Figure 3:
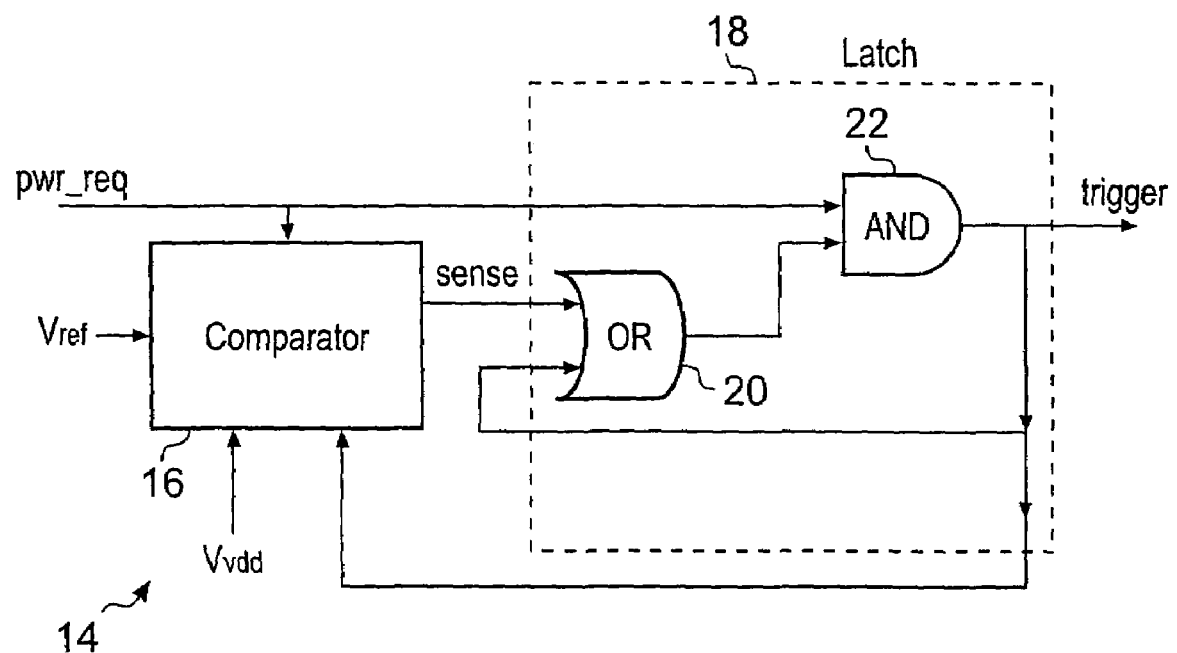
FIG. 3 is a block circuit diagram illustrating a power-on controller incorporating a comparator and a latch.

FIG. 3 illustrates a power-on controller 14 formed of a comparator 16 and a latch 18. A power-required signal pwr_req supplied to the comparator 16 initiates its operation in comparing a virtual supply rail voltage VVdd with a reference voltage Vref. When the virtual supply rail voltage VVdd exceeds the reference voltage Vref (due to charging through the weak path via weak header transistors 12 during the pre-charge mode), then a sense output signal is generated and supplied to an OR gate 20 within the latch 18. This signal propagates to an AND gate 22 where the other input is formed by the power-required signal pwr_req. The output from the AND gate 22 is a trigger signal which is used to switch on the strong header transistors 10 (the strong header transistors provide the strong path during the active mode when the logic block (circuitry) 4 is active). The trigger signal is fedback to the OR gate 20 where it forms the other input to the OR gate 20 and accordingly latches the trigger signal within the latch 18 irrespective of any changes in the sense signal from the comparator 16 provided that the power-required signal pwr_req remains asserted. When the power-required signal pwr_req is cleared, then this results in the AND gate 22 clearing the trigger signal. The trigger signal is also supplied (with a suitable delay) to the comparator 16 where it is used to disable the comparator 16 once it has performed its comparison function and generated the sense signal since this will reduce power consumption by the comparator 16.

Figure 4:
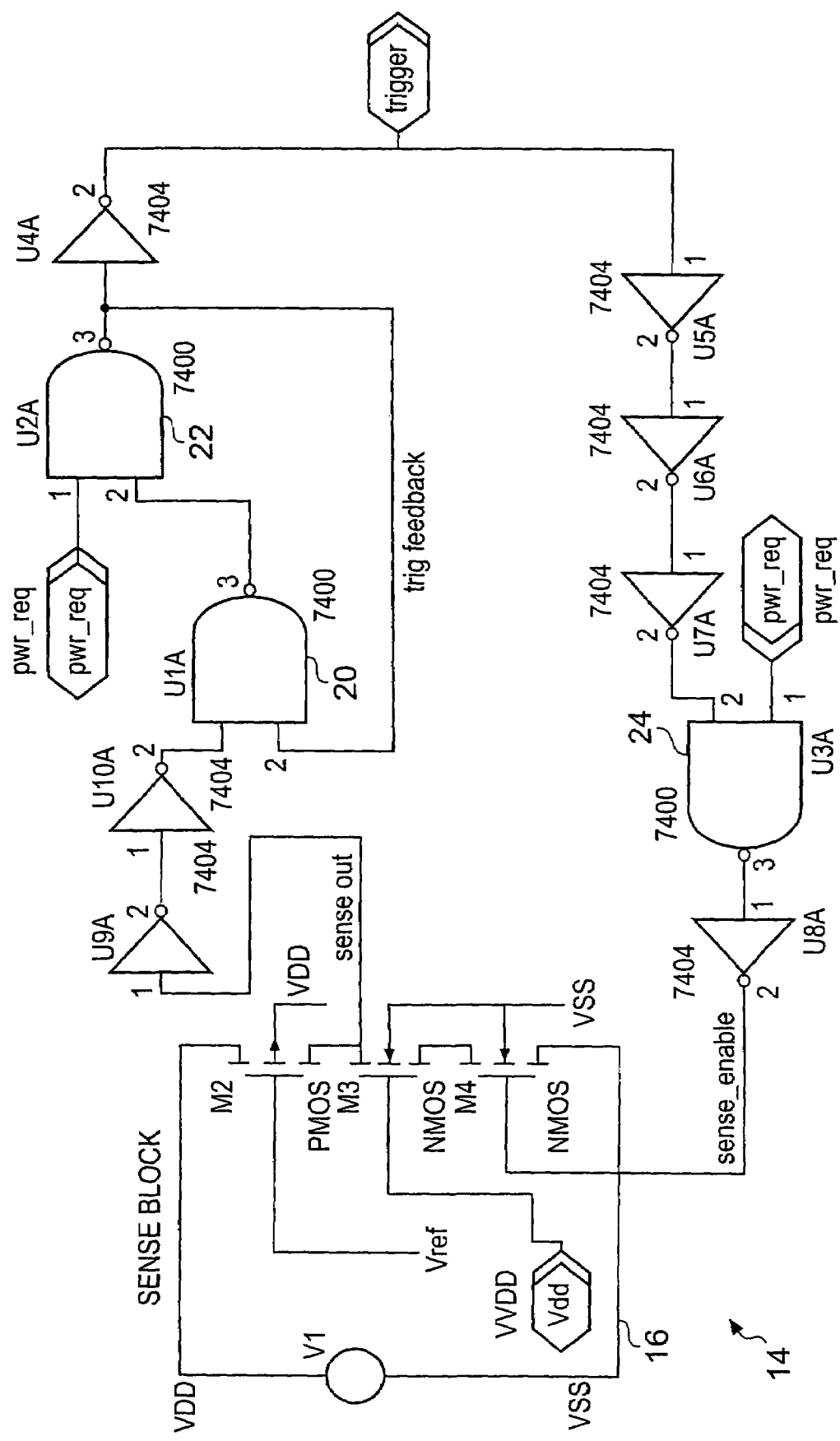
FIG. 4 is a more detailed representation of a circuit of FIG. 3.

FIG. 4 is a more detailed illustration of the circuit of FIG. 3. It will be seen that the circuit elements illustrated in FIG. 4 are the logical equivalent of those illustrated in FIG. 3 with some Boolen transformations having been performed. The action of the trigger signal in disabling the comparator 16 can be seen by its input to the gate 24 in combination with the power-required signal pwr_req which serves to initially enable the comparator 16 once the trigger output has been cleared.

Figure 5:
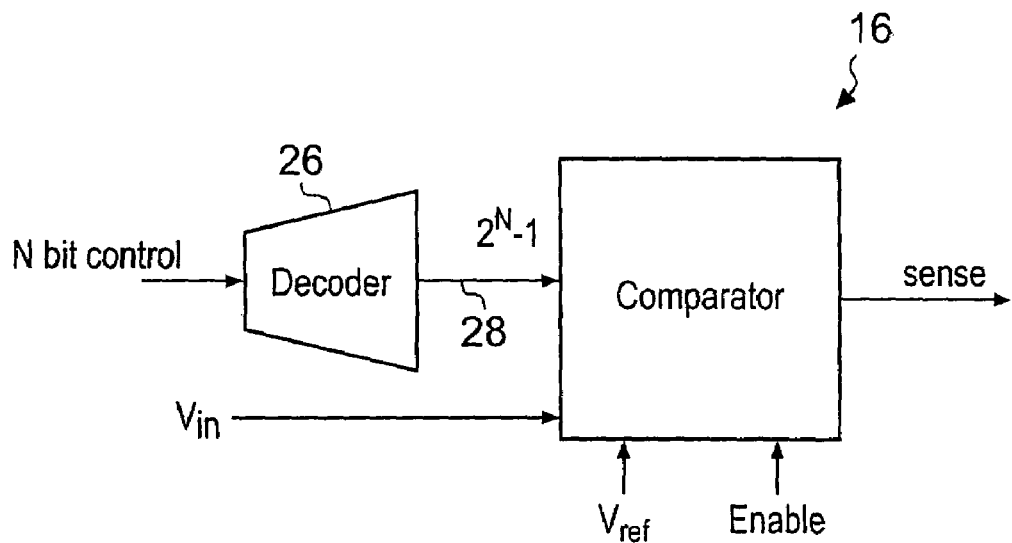
FIG. 5 schematically illustrates a comparator with a programmable trigger level.

FIG. 5 schematically illustrates a comparator 16 which is programmable using an N-bit reference-setting signal to select one of a plurality of reference voltages to be used by the comparator 16. These different reference voltages are generated based upon the single Vref reference voltage supplied as will be described later. The N-bit reference-setting signal is decoded by a decoder 26 into a thermometer coded signal 28.

Figure 6:
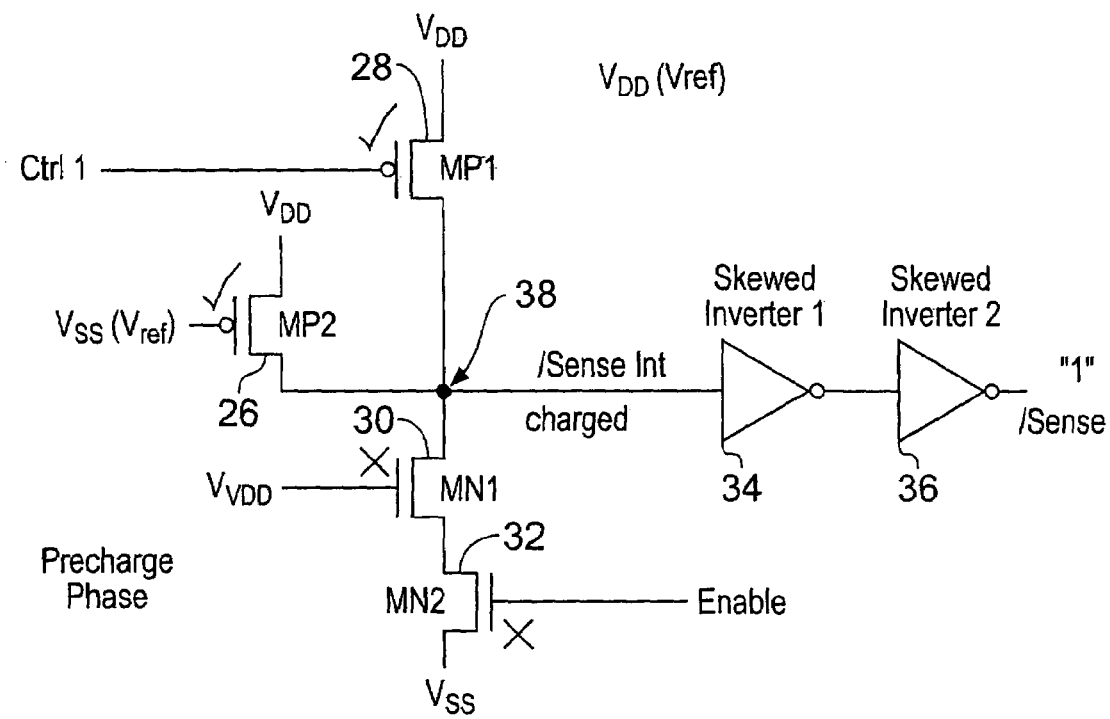
FIGS. 6 to 9 illustrate the operation of a comparator with a programmable trigger level.

FIG. 6 illustrates a simple form of a programmable comparator 16 which may be used in accordance with the present techniques. This comparator has uses beyond those of the power-control techniques described herein, such as during manufacturing test operations. The programmable comparator 16 shown in FIG. 6 is of a type suitable for use in controlling header transistors by detecting when a virtual supply rail voltage VVdd reaches a level suitable for switch on of the strong header transistor 10. The comparator 16 comprises two charging transistors 26, 28 and one discharging transistor 30. An enable transistor 32 serves to isolate current flow through the transistor stack when the comparator 16 is inactive, such as during the precharge phase illustrated in FIG. 6. Two skewed inverters 34, 36 are used to sense the level of the voltage at the node 38 and generate a sense signal output.

In the precharge phase illustrated in FIG. 6, the enable transistor is switched off and the charging transistors 26 and 28 are switched on resulting in the node 38 becoming charged. The enable transistor 32 is of a sufficient size that it remains non-saturated throughout the operation of the comparator 16.

Figure 7:
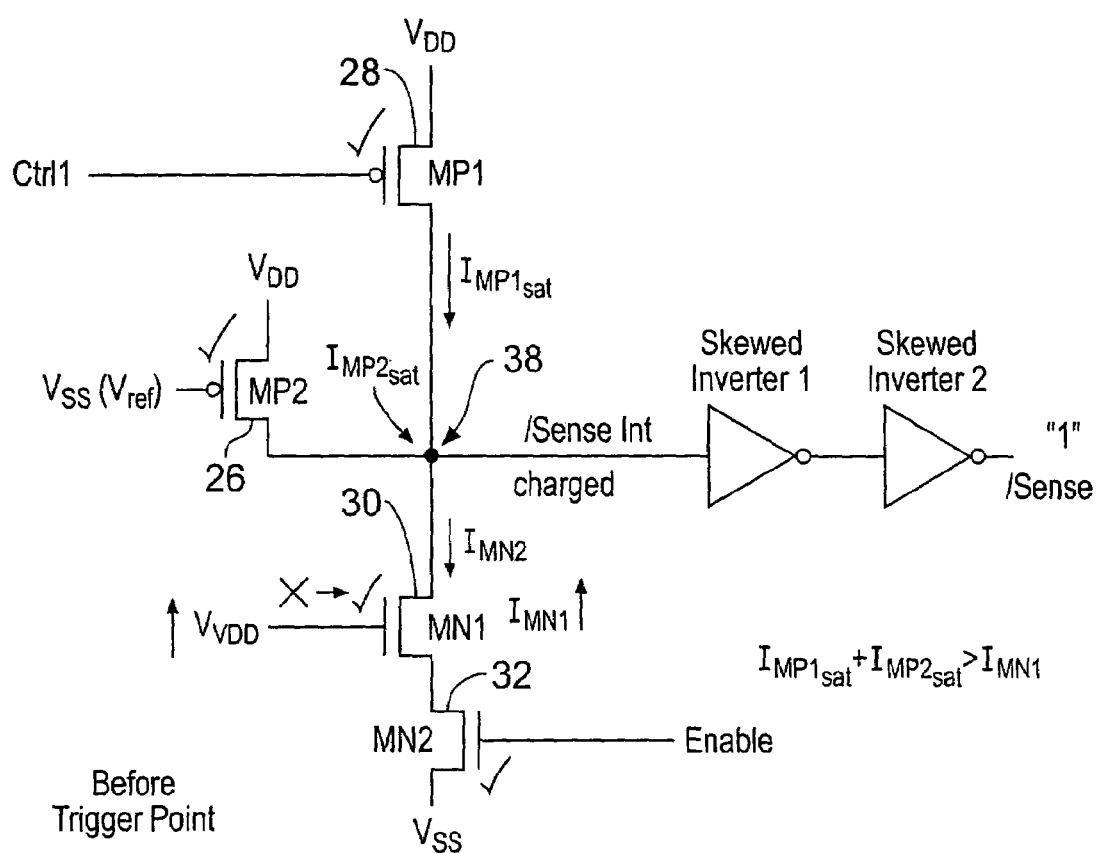
Figure 8:
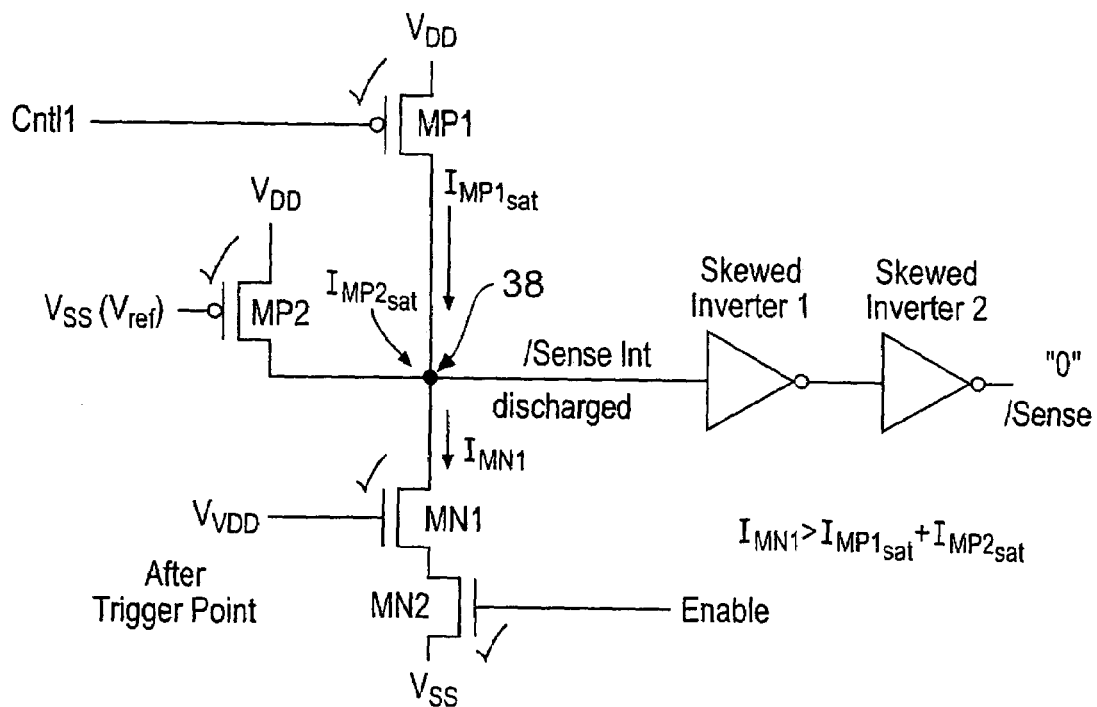

As shown in FIG. 7, when the enable transistor 32 is switched on and the virtual supply rail voltage VVdd starts to rise, the discharging transistor 30 will start to pass a current controlled by the level of the virtual supply rail voltage VVdd. The current discharged through the discharge transistor 30 will act to oppose the charging currents being supplied to the node 38 by the charging transistors 26 and 28 which remain switched on. The physical sizes of the charging transistors 26 and 28 (as well as other properties thereof) are selected such that they enter a saturated mode of operation in which the current therethrough does not increase even if the voltage across the charging transistors is increased. As a consequence, as the virtual supply rail voltage VVdd continues to rise, and accordingly the current through the discharging transistor 30 continues to rise, a point is reached at which the discharge current will exceed the charging current. This point has not yet been reached in FIG. 7, but FIG. 8 illustrates the situation after this point has been reached. When the discharge current exceeds the charging current, then this discharges the node 38 and accordingly the skewed inverters 34, 36 produce a change in the sense signal. In this example the sense signal becoming low indicates that the virtual supply rail voltage VVdd has exceeded the trigger point.

Figure 9:
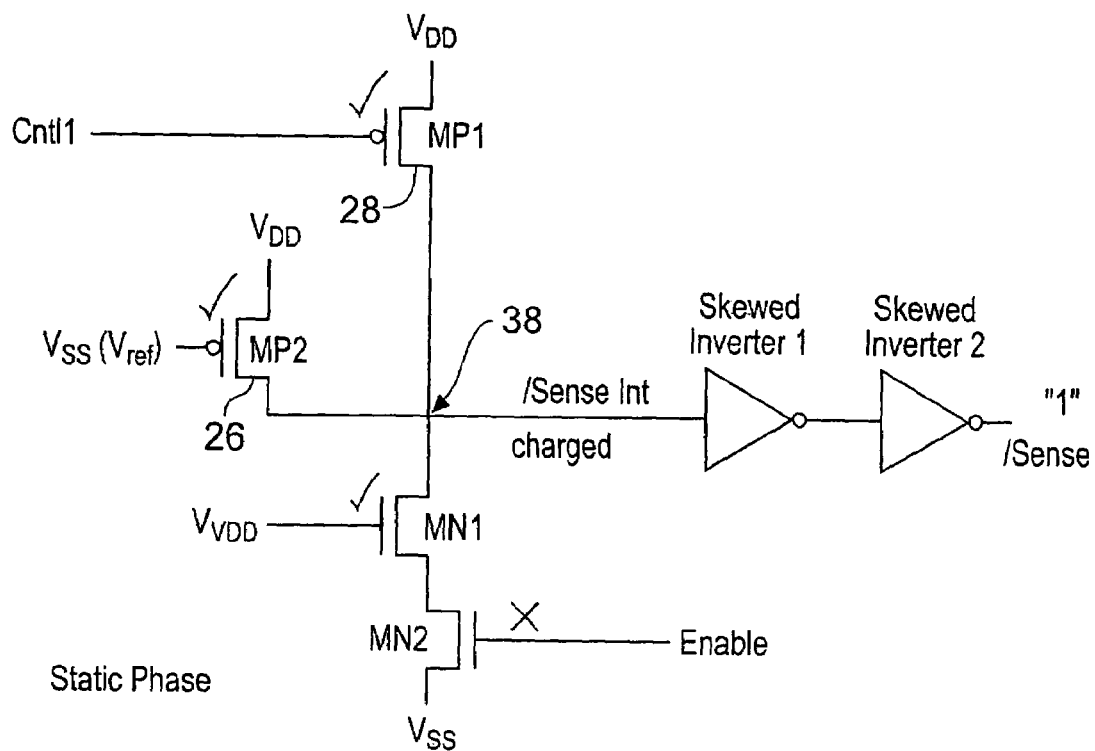

FIG. 9 illustrates a static phase of operation in which the enable transistor 32 has been switched off and the virtual supply rail voltage VVdd remains high. In this state the charging transistors 26, 28 remain switched on and accordingly the node 38 will be charged.

FIGS. 6 to 9 illustrate the sensing action of the comparator 16. The programmable nature of this sensing action is achieved by selecting how many charging transistors 26, 28 are active. In the example illustrated in FIGS. 6 to 9 there are two trigger levels selectable in dependence upon whether the control signal Ctrl1 is high or low and accordingly whether or not the charging transistor 28 is or is not active. It will be appreciated that many more charging transistors 26, 28 can be provided and with each additional charging transistor 26, 28 there will be realised a different trigger level for the comparator 16 as the sum of the saturated currents through these charging transistors 26, 28 will correspond to a different current through the discharging transistor 30. Since the discharging transistor 30 is operating in its linear range (or at least substantially linear), these different currents will correspond to different virtual supply rail voltages VVdd being supplied to the gate of the charging transistor 30.

Figure 10:
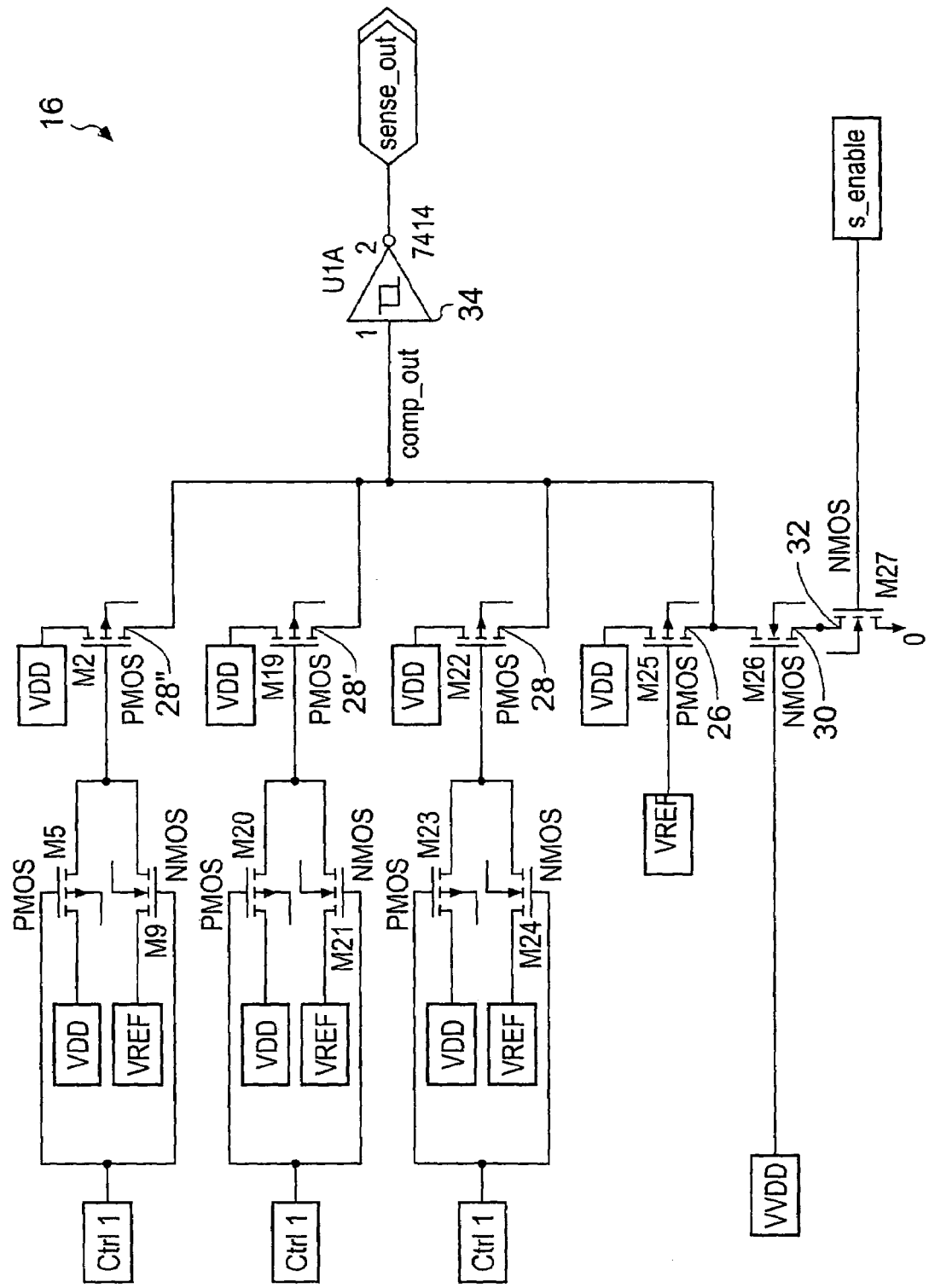
FIG. 10 is a circuit diagram illustrating in more detail another example of a programmable trigger level comparator.

FIG. 10 illustrates a further example embodiment of a programmable comparator 16 supporting multiple trigger levels. In this example there are four possible trigger levels corresponding to the action of one, two, three or four of the charging transistors 26, 28, 28', 28". In this context, it will be seen how the thermometer decoding of the reference-setting signal can be used to supply the enable signals to the charging transistors 28, 28', 28".

Figure 11:
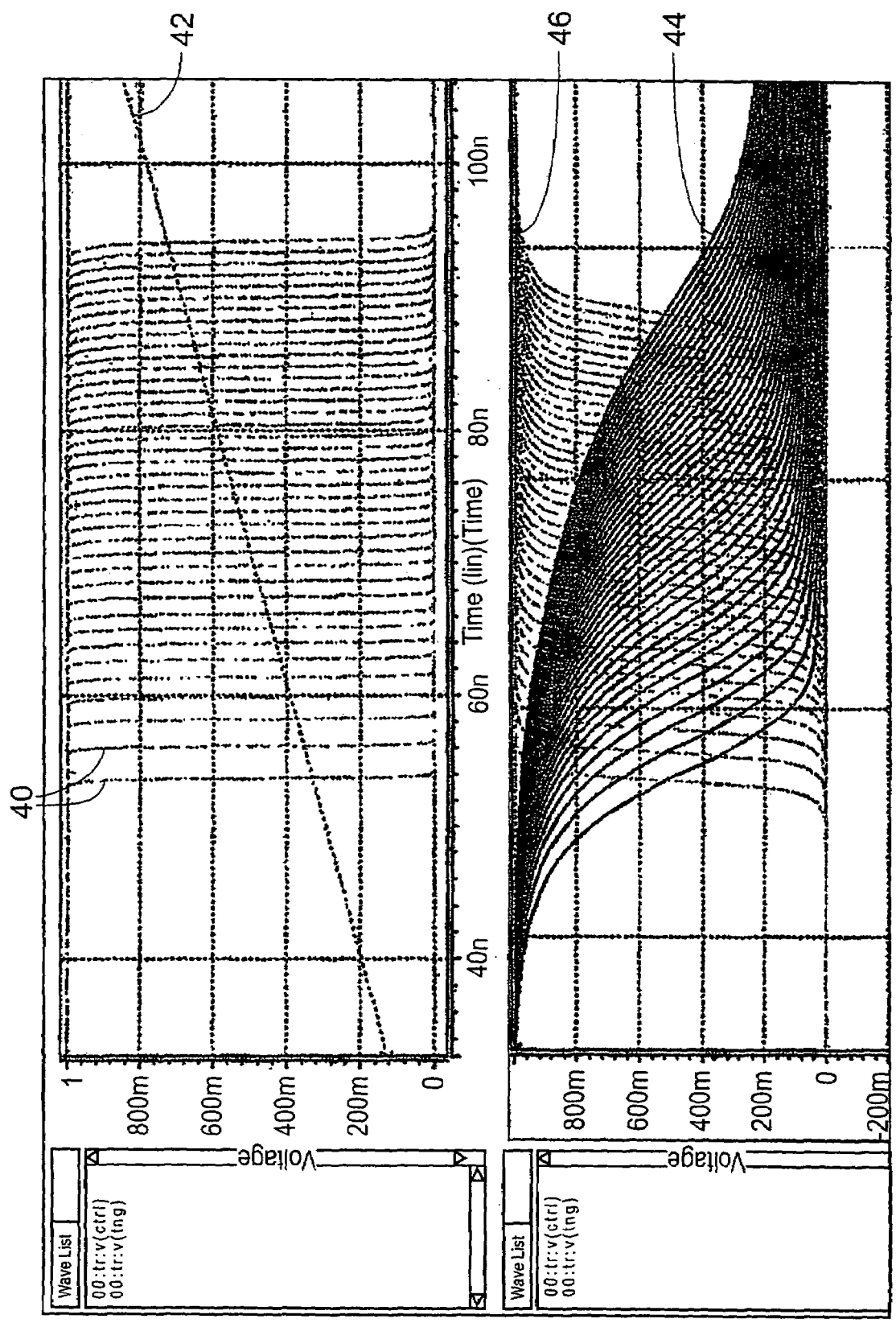
FIG. 11 illustrates simulated waveforms showing the behaviour of voltage levels within a programmable comparator.

FIG. 11 illustrates example signal voltage levels in a programmable comparator in accordance with the techniques illustrated previously. Signal line 38 illustrates a gradually increasing virtual supply rail voltage. Each of the lines 40 corresponds to the transition in the sense signal output for a respective different reference-setting signal. It will be seen that in this example there are a large number of possible trigger levels. The curves drawn show that whilst the variation in trigger level is not linear as the number of charging transistors 28, 28', 28" increases, there is nevertheless a steady increase which can be used to sense over a wide range of virtual supply rail voltage levels. The bottom portion of FIG. 11 illustrates the changes in the voltage levels at the node 38 as shown by the signal lines 44 for different numbers of charging transistors 28, 28', 28". The corresponding outputs 46 of the skewed inverters 34, 36 are also illustrated showing how these have a more desirable fully-on or fully-off characteristic.

Figure 12:
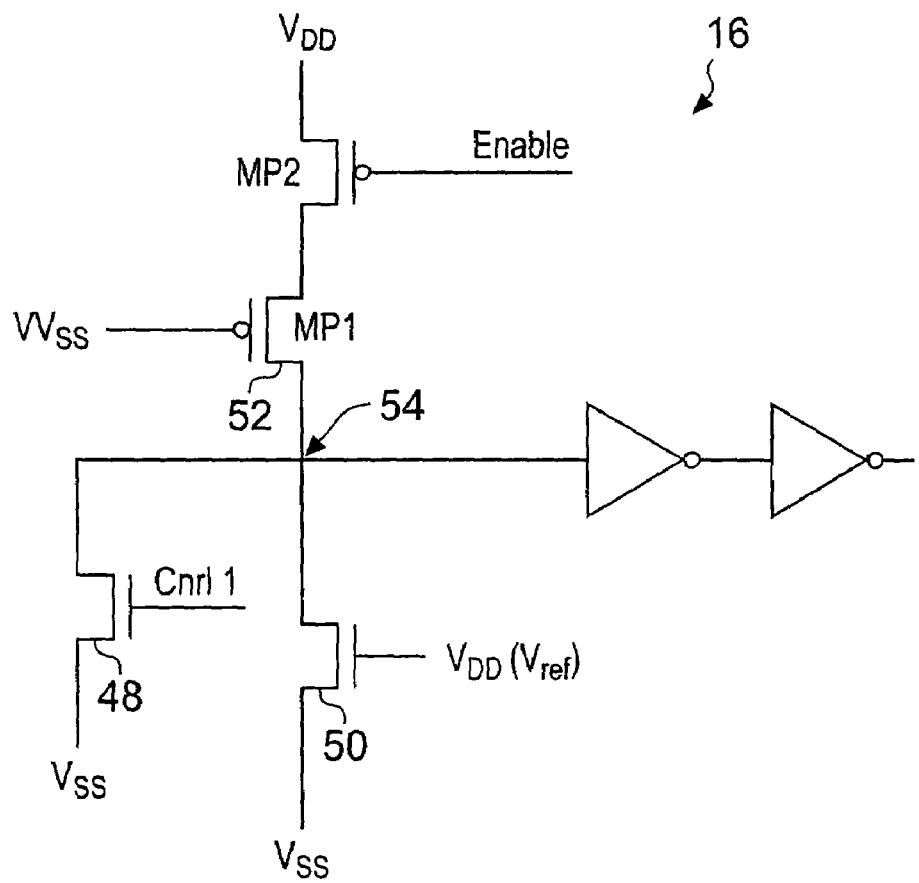
FIG. 12 is a further example of a programmable comparator.

FIG. 12 illustrates an alternative programmable comparator 16 which can be used in association with footer transistors. This has the same form as that illustrated in FIGS. 6 to 9, but with the transistor types inverted and all of the signal values/levels inverted. In this case, there are a plurality of discharging transistors 48, 50 which oppose the action of a charging transistor 52 (operating in its linear regime). The node 54 is initially discharged and becomes charged when the variable voltage corresponding to the virtual ground rail voltage Vvss reaches a sufficiently low level.

The devices above could take a variety of different forms including CMOS transistors, MTCMOS transistor and silicon on insulator devices that are well suited to low power and high density implementations.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
   power switching circuitry coupled to a power source having a source voltage level and to a virtual power rail;
   logic circuitry coupled to said virtual power rail to draw power therefrom; and
   a power-on controller coupled to said power switching circuitry to control said power switching circuitry to operate in a plurality of modes include a pre-charge mode in which said virtual power rail is connected to said power source via a weak path during pre-charging of said virtual power rail and an active mode in which said virtual power rail is connected to said power source via a strong path during active operation of said logic circuitry; wherein
   said power-on controller comprises:
   a comparator responsive to a voltage on said virtual power rail passing a reference voltage, while being driven toward said source voltage by conduction through said power switching circuitry during said pre-charge mode, to output a sense signal; and
   a latch responsive to said sense signal to latch a trigger signal coupled to said power switching circuitry to switch said power switching circuitry to said active mode.

2. An integrated circuit as claimed in claim 1, wherein said power switching circuitry comprises:
   a first power rail coupled to said power source having said source voltage level;
   a first transistor coupled to said first power rail and providing said strong path; and
   a second transistor coupled to said first power rail and providing said weak path; wherein
   said virtual power rail is coupled to said first transistor, during said pre-charge mode conduction through said second transistor drives said voltage on said virtual power rail toward said reference voltage and said trigger signal is coupled to said first transistor to switch said first transistor to a conductive state during said active mode.

3. An integrated circuit as claimed in claim 1, wherein said power-on controller has a power-required input receiving a power-required signal indicative of a requirement to connect said virtual power rail to said power source via said strong path.

4. An integrated circuit as claimed in claim 3, wherein said power-on controller is responsive to clearing of said power-required signal to clear said trigger signal stored by said latch and accordingly switch said power switching circuitry from said active mode.

5. An integrated circuit as claimed in claim 3, wherein said power-on controller is responsive to said power-required signal to switch said power switching circuitry to said pre-charge mode to drive said voltage on said second power rail toward said reference voltage.

6. An integrated circuit as claim in claim 1, wherein said comparator to switched to an inactive state in response to said trigger signal being latched by said latch.

7. An integrated circuit as claimed in claim 2, wherein said second transistor and said first transistor are header transistors, said first power rail is a supply voltage rail and said virtual power rail is a virtual supply voltage rail.

8. An integrated circuit as claimed in claim 2, wherein said second transistor and said first transistor are footer transistors, said first power rail is a ground voltage rail and said virtual power rail is a virtual ground voltage rail.

9. An integrated circuit as claimed in claim 1, wherein said comparator is responsive to a reference-setting signal to set said reference voltage to one of a predetermined set of reference voltages.

10. An integrated circuit as claimed in claim 9, wherein said comparator comprises at least one discharge-transistor capable of removing charge from a node within said comparator at a rate controlled by a difference between a fixed voltage and said voltage on said virtual power rail and a plurality of charge-transistors each capable of supplying charge to said node a maximum saturated rate, said reference-setting signal controlling how many of said plurality of charge-transistor are active in supplying charge to said node in opposition to said at least one discharge-transistor removing charge from said node and accordingly by how much said voltage on said virtual power rail must differ from said fixed voltage in order to discharge said node.

11. An integrated circuit as claimed in claim 9, wherein said comparator comprises at least one charge-transistor capable of supplying charge to a node within said comparator at a rate controlled by a difference between a fixed voltage and said voltage on said virtual power rail and a plurality of discharge-transistors each capable of removing charge from said node a maximum saturated rate, said reference-setting signal controlling how many of said plurality of discharge-transistor are active in removing charge from said node in opposition to said at least one charge-transistor supplying charge to said node and accordingly by how much said voltage on said virtual power rail must differ from said fixed voltage in order to charge said node.

12. An integrated circuit as claimed in claim 10, wherein said comparator comprises a decoder responsive to said reference-setting signal to generate a thermometer coded signal to control how many of said charge transistors are active.

13. An integrated circuit as claimed in claim 11, wherein said comparator comprises a decoder responsive to said reference-setting signal to generate a thermometer coded signal to control how many of said discharge transistors are active.

14. An integrated circuit as claimed in claim 10, comprising a skewed inverter coupled to said node and responsive to said node discharging to a predetermined level to generate a comparator output signal.

15. An integrated circuit as claimed in claim 11, comprising a skewed inverter coupled to said node and responsive to said node charging to a predetermine level to generate a comparator output signal.

16. An integrated circuit as claimed in claim 10, wherein said comparator comprises an enable transistor connected to selectively block discharging of said node in response to an enable signal and to thereby force said node to a high voltage level.

17. An integrated circuit as claimed in claim 11, wherein said comparator comprises an enable transistor connected to selectively block charging of said node in response to an enable signal and to thereby force said node to a low voltage level.

18. An integrated circuit as claimed in claim 1, wherein said integrated circuit is formed of CMOS transistors.

19. An integrated circuit as claimed in claim 18, wherein said integrated circuit is formed of MTCMOS transistors.

20. An integrated circuit as claimed in claim 1, wherein said integrated circuit is formed as a silicon on insulator device.

21. An integrated circuit as claimed in claim 2, wherein said first transistor is a high conductance transistor and said second transistor is a low conductance transistor.

22. An integrated circuit comprising:
power switching means coupled to a power source having a source voltage level and to a virtual power rail;
logic means coupled to said virtual power rail to draw power therefrom; and
a power-on control means coupled to said power switching means for controlling said power switching circuitry to operate in a plurality of modes include a pre-charge mode in which said virtual power rail is connected to said power source via a weak path during pre-charging of said virtual power rail and an active mode in which said virtual power rail is connected to said power source via a strong path during active operation of said logic means; wherein
said power-on control means comprises:
comparator means for outputting a sense signal in response to a voltage on said virtual power rail passing a reference voltage, while being driven toward said source voltage by conduction through said power switching means during said pre-charge mode; and
latch means for latching a trigger signal coupled to said power switching means in response to said sense signal to switch said power switching circuitry to said active mode.

23. A comparator for use within an integrated circuit and responsive to a reference-setting signal to compare a variable voltage with a selected one of a plurality of predetermined voltages, said comparator comprising:
at least one discharge-transistor capable of removing charge from a node within said comparator at a rate controlled by a difference between a fixed voltage and said variable voltage; and
a plurality of charge-transistors each capable of supplying charge to said node at a maximum saturated rate, said reference-setting signal controlling how many of said plurality of charge-transistor are active to supply charge to said node in opposition to said at least one discharge-transistor removing charge from said node and accordingly by how much said variable voltage must differ from said fixed voltage in order to discharge said node, wherein said comparator comprises a decoder responsive to said reference-setting signal to generate a thermometer coded signal to control how many of said charge transistors are active.

24. A comparator for use within an integrated circuit and responsive to a reference-setting signal to compare a variable voltage with a selected one of a plurality of predetermined voltages, said comparator comprising:
   at least one charge-transistor capable of supplying charge to a node within said comparator at a rate controlled by a difference between a fixed voltage and said variable voltage; and
   a plurality of discharge-transistors each capable of removing charge from said node at a maximum saturated rate, said reference-setting signal controlling how many of said plurality of discharge-transistor are active to remove charge from said node in opposition to said at least one charge-transistor supplying charge to said node and accordingly by how much said variable voltage must differ from said fixed voltage in order to charge said node, wherein said comparator comprises a decoder responsive to said reference-setting signal to generate a thermometer coded signal to control how many of said discharge transistors are active.

25. A method of controlling power-on operation in an integrated circuit having power-switching circuitry coupled to a power source having a source voltage level and to a virtual power rail and logic circuitry coupled to said virtual power rail to draw power therefrom, said method comprising the steps of:
   driving a voltage on said virtual power rail toward a reference voltage by conduction through a weak path through said power-switching circuitry during a pre-charge mode;
   comparing a voltage on said virtual power rail with a reference voltage to detect said voltage on said virtual power rail passing said source voltage;
   in response to said voltage on said second power rail passing said source voltage, outputting a sense signal; and
   in response to said sense signal, latching a trigger signal coupled to said power switching circuitry to switch said power switching circuitry to an active mode in which said virtual power rail is connected to said power source via a strong path during active operation of said logic circuitry.

26. A method of comparing a variable voltage with a selected one of a plurality of predetermined voltages within an integrated circuit, said selected one of said plurality of predetermined voltages being selected in response to a reference-setting signal, said method comprising the steps of:
   removing charge from a node with at least one discharge-transistor at a rate controlled by a difference between a fixed voltage and said variable voltage; and
   supplying charge to said node with a plurality of charge-transistors each capable of supplying charge at a maximum saturated rate, and
   controlling with said reference-setting signal how many of said plurality of charge-transistor are active to supply charge to said node in opposition to said at least one discharge-transistor removing charge from said node and accordingly by how much said variable voltage must differ from said fixed voltage in order to discharge said node; and
   generating, in response to said reference-setting signal, a thermometer coded signal to control how many of said charge-transistors are active.

27. A method of comparing a variable voltage with a selected one of a plurality of predetermined voltages within an integrated circuit, said selected one of said plurality of predetermined voltages being selected in response to a reference-setting signal, said method comprising the steps of:
   supplying charge to a node with at least one charge-transistor at a rate controlled by a difference between a fixed voltage and said variable voltage; and
   removing charge from said node with a plurality of discharge-transistors each capable of removing charge at a maximum saturated rate, and
   controlling with said reference-setting signal how many of said plurality of discharge-transistor are active to remove charge from said node in opposition to said at least one charge-transistor supplying charge from said node and accordingly by how much said variable voltage must differ from said fixed voltage in order to discharge said node; and
   generating, in response to said reference-setting signal, a thermometer coded signal to control how many of said discharge-transistors are active.

* * * * *